United States Patent
Shi

(10) Patent No.: US 10,411,041 B2
(45) Date of Patent: Sep. 10, 2019

(54) ARRAY SUBSTRATE, DISPLAY PANEL, AND DISPLAY DEVICE

(71) Applicant: Shenzhen China Star Optoelectronics Semiconductor Display Technology Co., Ltd., Shenzhen, Guangdong (CN)

(72) Inventor: Longqiang Shi, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 25 days.

(21) Appl. No.: 15/739,745

(22) PCT Filed: Sep. 20, 2017

(86) PCT No.: PCT/CN2017/102358
§ 371 (c)(1),
(2) Date: Dec. 24, 2017

(87) PCT Pub. No.: WO2019/015072
PCT Pub. Date: Jan. 24, 2019

(65) Prior Publication Data
US 2019/0019812 A1    Jan. 17, 2019

(51) Int. Cl.
*H01L 27/12* (2006.01)
*H01L 27/32* (2006.01)
*G09G 3/3266* (2016.01)
*G09G 3/3275* (2016.01)
(Continued)

(52) U.S. Cl.
CPC .......... *H01L 27/124* (2013.01); *G02F 1/163* (2013.01); *G09G 3/3266* (2013.01); *G09G 3/3275* (2013.01); *G09G 3/38* (2013.01); *H01L 27/322* (2013.01); *H01L 27/3232* (2013.01); *H01L 27/3262* (2013.01); *H01L 27/3276* (2013.01); *G02F 2001/1635* (2013.01); *H01L 27/3265* (2013.01)

(58) Field of Classification Search
CPC .............. H01L 27/124; H01L 27/3262; H01L 27/3276; H01L 27/322; H01L 27/3265; G09G 3/3266; G09G 3/3275; G09G 3/38; G02F 1/163; G02F 2001/1635
See application file for complete search history.

(56) References Cited

U.S. PATENT DOCUMENTS 9,395,576 B2    7/2016 Li
9,601,554 B2    3/2017 Park et al.
(Continued)

FOREIGN PATENT DOCUMENTS

CN    102751307 A    10/2012
CN    103645582 A    3/2014
(Continued)

*Primary Examiner* — Selim U Ahmed
(74) *Attorney, Agent, or Firm* — Andrew C. Cheng

(57) ABSTRACT

This invention discloses an array substrate, a display panel and a display device. The array substrate comprises a plurality of scanning lines and a first data line which are intersecting with each other to define a plurality of pixel regions; the pixel region with at least two situations: a transparent display mode and a non-transparent display mode in the electric field. The present invention can achieve different status in different scenes of the display panel and enlarges the scope of use of the display panel.

15 Claims, 3 Drawing Sheets

(51) Int. Cl.
*G09G 3/38* (2006.01)
*G02F 1/163* (2006.01)

(56) References Cited

U.S. PATENT DOCUMENTS

| | | | | |
|---|---|---|---|---|
| 2015/0008397 A1* | 1/2015 | Kim | ................... | H01L 27/3216 257/40 |
| 2016/0320656 A1 | 11/2016 | Chen | | |
| 2018/0286930 A1* | 10/2018 | Gai | ........................ | G02F 1/153 |

FOREIGN PATENT DOCUMENTS

| | | | |
|---|---|---|---|
| CN | 104133319 | A | 11/2014 |
| CN | 106952936 | A | 7/2017 |
| KR | 20170038545 | A | 4/2017 |

\* cited by examiner

ARRAY SUBSTRATE, DISPLAY PANEL, AND DISPLAY DEVICE

FIELD OF THE INVENTION

The present invention relates to the display technology, and more particularly to an array substrate, a display panel, and a display device.

BACKGROUND OF THE INVENTION

With the development of the flat display devices and comparing with the traditional liquid crystal display, OLED (Organic Light-Emitting Diode) display panel has gradually become a new generation of the mainstream flat panel display device because of its fast response, wide color gamut, ultra-thin, self-luminous, flexible and other characteristics. The transparent display, as a new display technology, allows the observer to see the background behind the screen through the display screen. This novel display technology can broaden the application of the display, and can be applied to mobile phones, computers, display windows and other display devices.

In the long history of the research, the inventors of the present application have found that the present OLED display panel can only achieve either non-transparent display or transparent display. The OLED display panel is required to achieve different display states in the different scenes. For example, when being as a TV to be watched, the user desires the OLED display panel to be a non-transparent display; when being as a window to be used, the user wants the OLED display panel to be transparent.

SUMMARY OF THE INVENTION

The present invention provides an array substrate, a display panel and a display device to solve the technical problem that the OLED display panel can only achieve either the non-transparent display or the transparent display in the prior art.

In order to solve the above-mentioned technical problems, the present invention is to provide an array substrate. The array substrate comprises
a plurality of scanning lines; and
a plurality of first data lines intersecting with the plurality of scanning lines to define a plurality of pixel regions;
wherein the pixel region has at least two states under the action of an electric field, the two states with at least transparent display mode and non-transparent display mode.
In order to solve the above-mentioned technical problems, the present invention is to provide a display panel comprising the array substrate.
In order to solve the above-mentioned technical problems, the present invention is to further provide a display device comprising the display panel.

The present invention is to allow the display panel to display in different situation in different scenes by providing the pixel region, under the electrical field, to be in different display situation with the transparent and the non-transparent display mode.

BRIEF DESCRIPTION OF THE DRAWINGS

In order to more clearly illustrate the embodiments of the present application, the following figures of the embodiments will be described briefly. It is obvious that the figures are merely some embodiments of the present application, those people of ordinary skill in this art can obtain other embodiments according to these figures without paying the premise.

DETAILED DESCRIPTION OF PREFERRED EMBODIMENTS

Embodiments of the present application are described in detail with the reference to the accompanying drawings as follows. It is clear that the described embodiments are part of embodiments of the present application, but not all embodiments. Based on the embodiments of the present application, all other embodiments to those of ordinary skill in the premise of no creative efforts acquired should be considered within the scope of protection of the present application.

Figure 1:
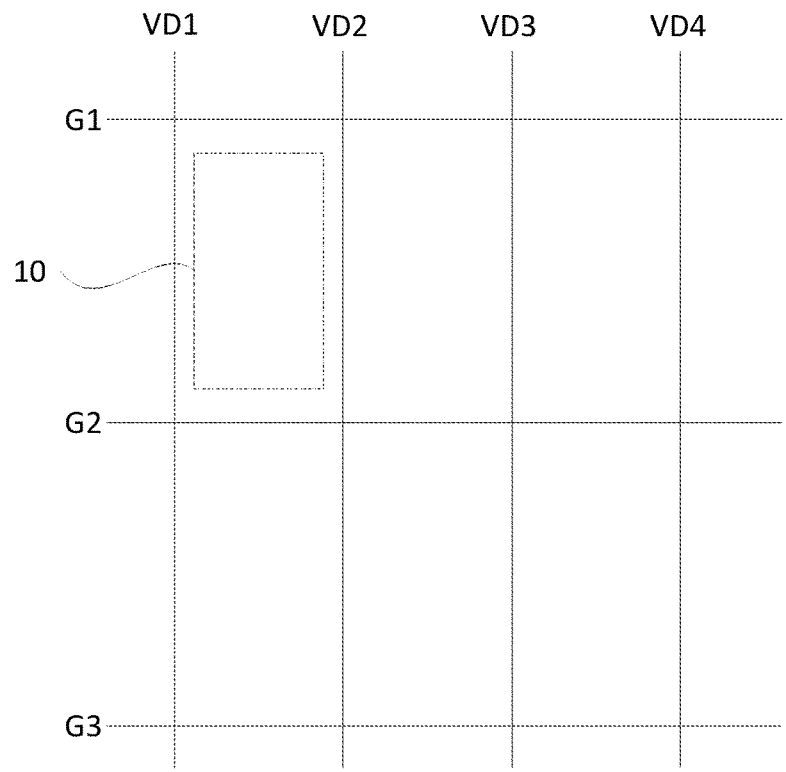
FIG. 1 is a schematic structural view of an array substrate of an embodiment of the present invention.
Figure 2:
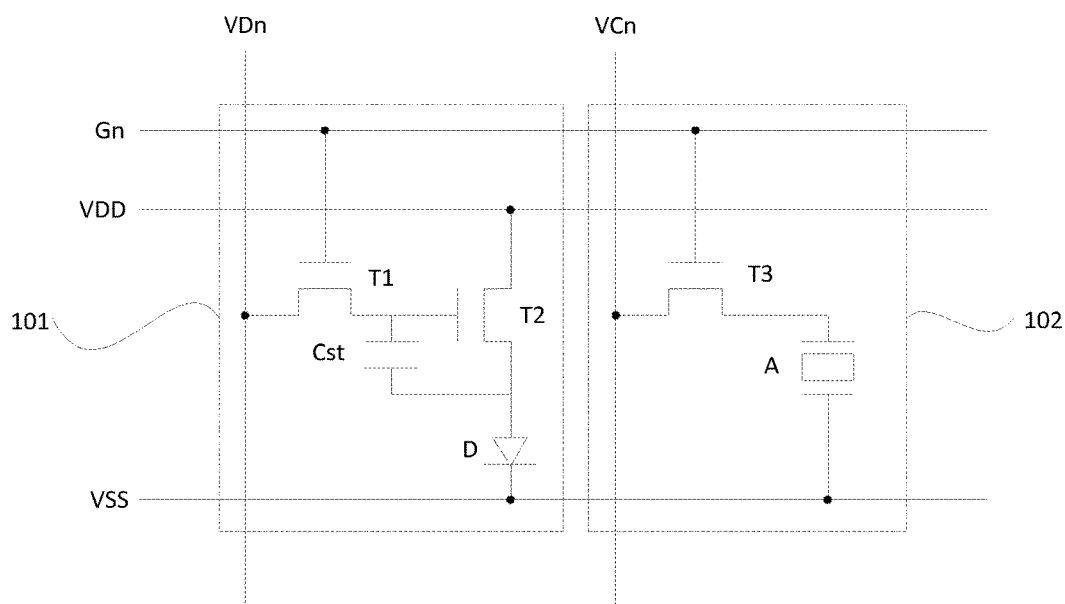
FIG. 2 is a schematic diagram of a pixel region circuit of an array substrate of an embodiment of the present invention.

Referring to FIG. 1 and FIG. 2, an array substrate of the embodiment in the present invention comprises
a plurality of scanning lines Gn, indicating G1-G3 in this embodiment; and
a plurality of first data lines VDn, indicating VD1-VD4 in the present embodiment, intersecting to a plurality of scanning lines Gn to define a plurality of pixel regions 10;
wherein the pixel region 10 has at least two display states under the action of an electric field, the two states are at least comprises a transparent display mode and a non-transparent display mode.

The pixel region 10 comprises a first sub-pixel region 101 and a second sub-pixel region 102. The region 101 comprises a light-emitting element D, a first thin film transistor T1, a second thin film transistor T2 and a storage capacitor Cst. The light-emitting element D is corresponding to the color of the display content. The first terminal of the first thin film transistor T1 is connected to the scanning line Gn. The second terminal of the first thin film transistor T1 is connected to the data line VDn, and the third terminal of the first thin film transistor T1 is connected to the first terminal of the first terminal of the light-emitting element D through the storage capacitor Cst. The second terminal of the light-emitting element D is connected to the low voltage power VSS. The first terminal of the second thin film transistor T2 is connected to the third terminal of the first thin film transistor T1. The second terminal of the transistor T2 is connected to the first terminal of the light emitting element D. The third terminal of the second thin film transistor T2 is connected to the high voltage power VDD.

The storage capacitor Cst is formed by the third terminal of the first thin film transistor T1 and the first terminal of the light emitting element D. To be more specifically, the first terminal of the second thin film transistor T2 is connected between the third terminal of the first thin film transistor T1 and the first terminal of the storage capacitor Cst; the second terminal of the second thin film transistor T2 is connected to the second terminal of the storage capacitor Cst and the second terminal of the light-emitting element D.

The light emitting element D may be a red light emitting diode, a green light emitting diode, and a blue light emitting diode. The light emitting element D may be also a red light emitting diode, a green light emitting diode, a blue light emitting diode, and a white light emitting diode. The array substrate further comprises a plurality of second data lines VCn which are interested with the plurality of scanning lines Gn. The second sub-pixel region 102 comprises a color changing element A and a third thin film transistor T3. The color changing element A for changing the light transmittance under the action of an electric field which is to cooperate with the light emitting element D to achieve the transparent display or the non-transparent display. The first terminal of a third thin film transistor T3 is connected to the scanning line Gn. The second terminal of the third thin film transistor T3 is connected to the second data line VCn. The third terminal of the third thin film transistor T3 is connected to one terminal of the color changing element A, and the other terminal of the color changing element A is connected to low voltage power VSS.

Figure 3:
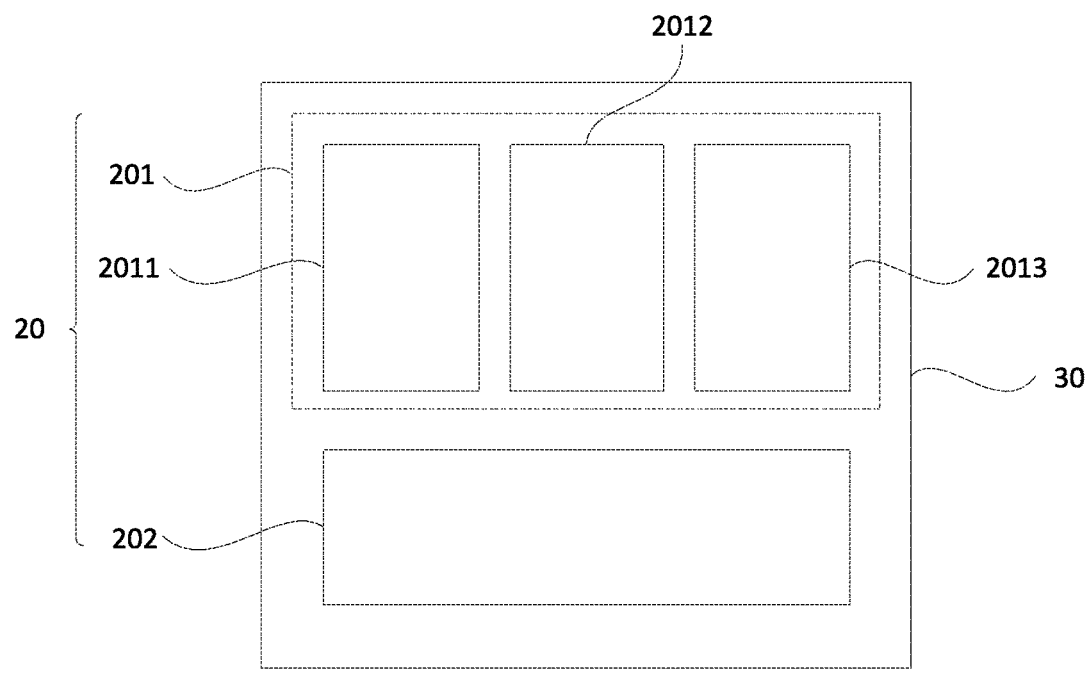
FIG. 3 is a schematic diagram of a pixel region structure of an array substrate of an embodiment of the present invention.
Figure 4:
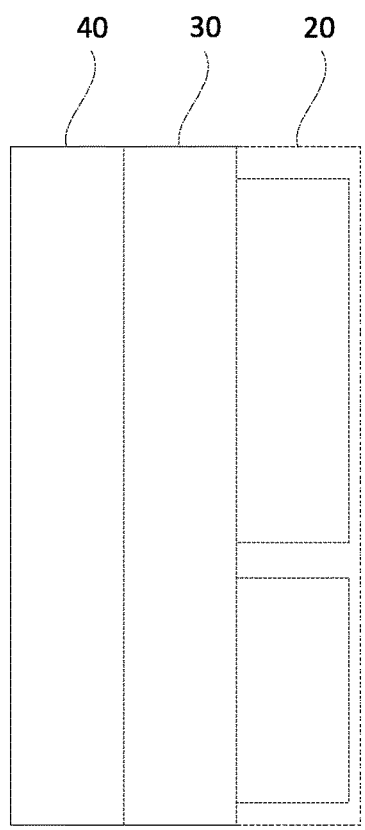
FIG. 4 is a schematic diagram of a pixel region structure of an array substrate of an embodiment of the present invention.

Referring to FIG. 2 to FIG. 4, the array substrate comprises a transparent substrate 40, a driving layer 30 and a display layer 20.

In the present embodiment, the driving layer 30 is corresponding to the driving circuit of the pixel region 10. The pixel region 10 comprises a scanning line Gn, a first data line VDn, a second data line VCn, a high voltage power supply VDD, a low voltage power supply VSS, a first thin film transistor T1 of a first sub-pixel region 101, a second thin film transistor T2 a storage capacitor Cst, and a third thin film transistor T3 of sub-pixel region 102. The display layer 20 is corresponding to the light-emitting element D of the first sub-pixel region 101 and the chromatic element A of the second sub-pixel region.

In the present embodiment, the display layer 20 comprises a first display area 201 and a second display area 202. The first display area 201 is corresponding to the light emitting element D. In the present embodiment, the red light emitting area 2011 is a red light emitting diode, the light emitting area 2012 is the green light emitting diode, the blue light emitting area 2013 is the blue light emitting diode, and the second display area 202 is the color changing element A. Optionally, the light emitting element D is an OLED (Organic Light-Emitting Diode).

To be more specifically, the scanning line Gn outputs a high level or a low level voltage to a gate of the first thin film transistor T1, and the scanning line Gn outputs a high level, when the first thin film transistor T1 is turned on, the first data line VDn transmits the data to the first terminal of the second thin film transistor T2. In the other words, the gate of the second thin film transistor T2, the data is stored in the storage capacitor Cst.

The data stored in the storage capacitor Cst during the switching of the image data of the display panel from the (n) frame to the (n+1) frame, is capable of holding the high level of the first terminal of the second thin film transistor T2 for a period of time so that the light emitting element D keeping lighting before the (n+1) frame data appears in the display panel.

Optionally, the color changing element A may be an oxidized state electrochromic device or a reduced state electrochromic device.

The color changing element is transparent when the oxidized state shades the electrochromic device with the voltage. The color changing element is opaque when the oxidizing state is colored to the electrochromic device without voltage. The color changing element is opaque when the reduced coloring electrochromic device is added with voltage and the color changing element is transparent when the electrochromic device of the reduced state without voltage.

Optionally, the oxidized coloring electrochromic device may be made of NiOx (nickel oxide) or IrO2 (iridium oxide) or the like. The reduced color electrochromic device can be made of WO3 (tungsten trioxide), MoO3 (molybdenum trioxide), Nb2O5 (niobium pentoxide) or TiO2 (titanium dioxide) or the like.

In the present embodiment, the color changing element A is a reduced-state coloring electrochromic device formed by WO3, and the driving layer 30 receives image data to drive the first display area 201 to display normally. When the display panel is required to be opaque, for example, as being a television is used, the DC/DC power is added to the second data line VCn. When the display panel is required to be transparent, for example, as being a window is used, the DC low voltage power is added to the second data line VCn. Therefore, the display panel in the present invention achieves different states due to the different scenes.

According to the embodiment of the present invention, it is possible to achieve that a display panel to display in different states according to different scenes by providing a pixel region with different states under the action of an electric field. The different states comprise transparent display mode and non-transparent display mode. This enlarges the scope of use of the display panel.

Figure 5:
FIG. 5 is a schematic structural view of the display panel of an embodiment of the present invention.

Referring to FIG. 5, the display panel embodiment of the present invention comprises a first substrate 501 and a second substrate 502. The first substrate 501 is an array substrate which has been disclosed in the other embodiment, and will not be described it again herein. According to the embodiment of this invention, it is possible to achieve that a display panel to display in different states according to different scenes by providing a pixel region with different states under the action of an electric field. The different states comprise transparent display mode and non-transparent display mode. This enlarges the scope of use of the display panel.

Figure 6:
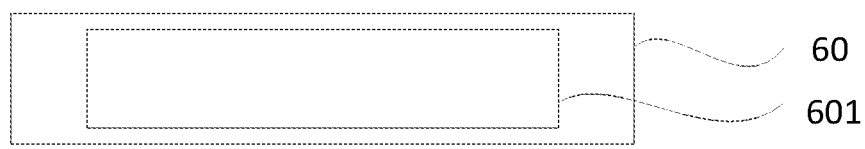
FIG. 6 is a schematic structural view of the display device of an embodiment of the present invention.

Referring to FIG. 6, the display device 60 embodiment of the present invention comprises a display panel 601 which has been disclosed in the other embodiment, and will not be described it again herein.

According to the embodiment of the present invention, it is possible to achieve that a display panel to display in different states according to different scenes by providing a pixel region with different states under the action of an electric field. The different states comprise transparent display mode and non-transparent display mode. This enlarges the scope of use of the display panel.

The above embodiments of the present invention does not intend to limit the scope of the present invention. Any modifications, equivalent replacements or improvements within the spirit and principles of the embodiment or direct or indirect applying to other related technology should be covered by the protected scope of the present invention.

What is claimed is:

1. A display panel comprising an array substrate, wherein the array substrate comprises:

a plurality of scanning lines; and a plurality of first data lines, intersecting with the plurality of scanning lines to define a plurality of pixel regions;
wherein the pixel region having at least two display situations under the action of an electric field, the two situations at least comprising transparent display mode and non-transparent display mode;
wherein the pixel region comprises a first sub-pixel region comprising a light-emitting element for emitting light corresponding to the color of the display content, a second sub-pixel region comprising a color changing element for changing the light transmittance under the action of an electric field and cooperating with the light-emitting element to achieve a transparent display or a non-transparent display;
wherein the color changing element is an oxidized state electrochromic device, which is transparent when the oxidation state electrochromic device is applied with a voltage, and to be opaque when the oxidized state electrochromic device is not applied with voltage;
the first sub-pixel region of the display panel further comprising: a first thin film transistor and a second thin film transistor, wherein a first terminal of the first thin film transistor being connected to the scanning line, a second terminal of the first thin film transistor is connected with the data line, a third terminal of the first thin film transistor is connected with a first terminal of the light emitting element through a storage capacitor, a second terminal of the light emitting element is connected with a low voltage power supply, the storage capacitor is formed by the third terminal of the first thin film transistor and the first terminal of the light emitting element; and the first terminal of the second thin film transistor is connected with the third terminal of the first thin film transistor, the second terminal of the second thin film transistor is connected with the first terminal of the light emitting element, and the second thin film transistor of the third terminal is connected to a high voltage power supply.

2. The display panel according to claim 1, wherein the array substrate further comprises a plurality of second data lines intersecting with the plurality of scanning lines; and
the second sub-pixel region further comprises:
a third thin film transistor, a first terminal of the third thin film transistor connected to the scanning line, a second terminal of the third thin film transistor connected to the second data line, a third terminal of the third thin film transistor connected to the terminal of the color changing element, and the other terminal of the color changing element is connected to a low voltage power supply.

3. The display panel according to claim 1, the color changing element is a reduced state coloring electrochromic device which is opaque when the reduced coloring electrochromic device is applied with a voltage, and is transparent when the reduced coloring electrochromic device is not applied with voltage of the display panel.

4. The display panel according to claim 1, wherein
the light emitting element is a red light emitting diode, a green light emitting diode and a blue light emitting diode; or
the light-emitting element is a red light emitting diode, a green light emitting diode, a blue light emitting diode, and a white light emitting diode of the display panel.

5. The display panel according to claim 1, wherein the light-emitting element is an OLED.

6. An array substrate, comprising:
a plurality of scanning lines;
a plurality of first data lines intersecting with the plurality of scanning lines to define a plurality of pixel regions;
wherein the pixel region comprises at least two display situations under the action of an electric field, and the two situations at least comprise transparent mode and non-transparent mode;
wherein the pixel region comprises:
a first sub-pixel region comprising a light-emitting element for emitting light corresponding to the color of the display content; and
a second sub-pixel region comprising a color changing element for changing the light transmittance under the action of an electric field and cooperating with the light emitting element to achieve a transparent display or a non-transparent display of the array substrate;
the first sub-pixel region further comprising: a first thin film transistor and a second thin film transistor, wherein a first terminal of the first thin film transistor is connected to the scanning line, a second terminal of the first thin film transistor is connected with the data line, a third terminal of the first thin film transistor is connected with a first terminal of the light emitting element through a storage capacitor, a second terminal of the light emitting element is connected with a low voltage power supply, the storage capacitor is formed by the third terminal of the first thin film transistor and the first terminal of the light emitting element; a first terminal of the second thin film transistor is connected with the third end of the first thin film transistor, a second end of the second thin film transistor is connected with the first end of the light emitting element, and the second thin film transistor of the third end is connected to a high voltage power supply of the array substrate.

7. The array substrate according to claim 6, wherein the array substrate further comprises a plurality of second data lines intersecting with the plurality of scanning lines; and
the second sub-pixel region further comprise: a third thin film transistor, a first terminal of the third thin film transistor connected to the scanning line, a second terminal of the third thin film transistor connected to the second data line, a third terminal of the third thin film transistor connected to one terminal of the color changing element, and the other terminal of the color changing element is connected to a low voltage power supply.

8. The array substrate according to claim 6, the color changing element is an oxidized state electrochromic device, which is transparent when the oxidation state electrochromic device is applied with a voltage, and is opaque when the oxidized state electrochromic device is not applied with voltage of the array substrate.

9. The array substrate according to claim 6, the color changing element is a reduced state coloring electrochromic device which is opaque when the reduced coloring electrochromic device is applied with a voltage, and is transparent when the reduced coloring electrochromic device is not applied with voltage of the array substrate.

10. The array substrate according to claim 6, the light emitting element is a red light emitting diode, a green light emitting diode and a blue light emitting diode;
or the light-emitting element is a red light emitting diode, a green light emitting diode, a blue light emitting diode, and a white light emitting diode of the array substrate.

11. The array substrate according to claim 6, the light-emitting element is an OLED.

12. A display device comprising a display panel, the display panel comprising an array substrate, wherein the array substrate comprises:
   a plurality of scanning lines; and
   a plurality of first data lines intersecting with the plurality of scanning lines to define a plurality of pixel regions;
   wherein the pixel region comprises at least two display situations under the action of an electric field, the two situations at least comprises transparent display mode and non-transparent display mode;
   the pixel region comprising:
   a first sub-pixel region comprising a light-emitting element for emitting light corresponding to the color of the display content; and
   a second sub-pixel region comprising a color changing element for changing the light transmittance under the action of an electric field and cooperating with the light emitting element to achieve transparent display or a non-transparent display of the display device;
   the first sub-pixel region further comprising: a first thin film transistor and a second thin film transistor;
   wherein a first terminal of the first thin film transistor is connected to the scanning line, a second terminal of the first thin film transistor is connected with the data line, a third terminal of the first thin film transistor is connected with a first end of the light emitting element through a storage capacitor, and the second terminal of the light emitting element is connected with a low voltage power;
   wherein the storage capacitor is formed by the third terminal of the first thin film transistor and the first terminal of the light emitting element;
   a first terminal of the second thin film transistor is connected with the third terminal of the first thin film transistor, a second terminal of the second thin film transistor is connected with a first terminal of the light emitting element, and a third terminal of the second thin film transistor is connected to a high voltage power.

13. The display device according to claim 12, wherein the array substrate further comprises a plurality of second data lines intersecting with the plurality of scanning lines; and
   the second sub-pixel region further comprises:
   a third thin film transistor, a first terminal of the third thin film transistor connected to the scanning line, a second terminal of the third thin film transistor connected to the second data line, a third terminal of the third thin film transistor connected to one terminal of the color changing element, and the other terminal of the color changing element connected to a low voltage power of the display device.

14. The display device according to claim 12, the color changing element is an oxidized state electrochromic device, which is transparent when the oxidation state electrochromic device is applied with a voltage, and is opaque when the oxidized state electrochromic device is not applied with voltage of the display device.

15. The display device according to claim 12, the color changing element is a reduced state coloring electrochromic device which is opaque when the reduced coloring electrochromic device is applied with a voltage, and is transparent when the reduced coloring electrochromic device is not applied with voltage of the display device.

* * * * *